(12) United States Patent
Hollis

(10) Patent No.: US 8,779,849 B2
(45) Date of Patent: Jul. 15, 2014

(54) APPARATUSES AND METHODS FOR PROVIDING CAPACITANCE IN A MULTI-CHIP MODULE

(75) Inventor: Timothy M. Hollis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 119 days.

(21) Appl. No.: 13/359,769

(22) Filed: Jan. 27, 2012

(65) Prior Publication Data

US 2013/0194032 A1   Aug. 1, 2013

(51) Int. Cl.
    H01L 25/00        (2006.01)

(52) U.S. Cl.
    USPC ......... 327/565; 327/594; 327/595; 361/306.2

(58) Field of Classification Search
    USPC ......... 327/538, 540, 541, 564, 565, 566, 543, 327/594, 595; 257/296, 298, 300, 306, 307, 257/532, E27.048, 906; 365/49.12, 102, 365/149; 361/302, 306.1, 306.2
    See application file for complete search history.

(56) References Cited

U.S. PATENT DOCUMENTS

| | | | |
|---|---|---|---|
| 5,032,892 A | 7/1991 | Chern et al. | |
| 5,519,831 A | 5/1996 | Holzhammer | |
| 5,880,925 A | 3/1999 | DuPre et al. | |
| 6,124,625 A | 9/2000 | Chern et al. | |
| 6,184,568 B1 | 2/2001 | Protigal et al. | |
| 6,344,961 B1 | 2/2002 | Naito et al. | |
| 6,448,628 B2 | 9/2002 | Chern et al. | |
| 6,990,603 B2 | 1/2006 | Strasser | |
| 7,451,348 B2 | 11/2008 | Pecone et al. | |
| 7,586,174 B2 | 9/2009 | Togashi et al. | |
| 7,613,877 B2 | 11/2009 | Shimozono et al. | |
| 8,090,988 B2 | 1/2012 | Hoang | |
| 2002/0017700 A1 | 2/2002 | Mori et al. | |
| 2009/0251862 A1 | 10/2009 | Knickerbocker et al. | |
| 2009/0290282 A1 | 11/2009 | Knickerbocker | |
| 2010/0008175 A1 | 1/2010 | Sweere et al. | |
| 2010/0164084 A1 | 7/2010 | Lee et al. | |
| 2010/0244189 A1 | 9/2010 | Klootwijk et al. | |
| 2010/0308435 A1 | 12/2010 | Nowak et al. | |
| 2010/0311371 A1* | 12/2010 | Abe et al. | 455/164.1 |
| 2011/0027962 A1 | 2/2011 | Bernstein et al. | |
| 2011/0031598 A1 | 2/2011 | Lee et al. | |
| 2011/0108948 A1 | 5/2011 | Kim et al. | |
| 2013/0039113 A1* | 2/2013 | Cremer et al. | 365/72 |
| 2013/0109135 A1* | 5/2013 | Lee et al. | 438/107 |

OTHER PUBLICATIONS

PCT Search Report and Written Opinion for International application No. PCT/US2013/022969 mailed May 15, 2013.

* cited by examiner

*Primary Examiner* — Lincoln Donovan
*Assistant Examiner* — Jung H Kim
(74) *Attorney, Agent, or Firm* — Dorsey & Whitney LLP

(57) ABSTRACT

Apparatuses, multi-chip modules, capacitive chips, and methods of providing capacitance to a power supply voltage in a multi-chip module are disclosed. In an example multi-chip module, a signal distribution component may be configured to provide a power supply voltage. A capacitive chip may be coupled to the signal distribution component and include a plurality of capacitive units. The capacitive chip may be configured to provide a capacitance to the power supply voltage. The plurality of capacitive units may be formed from memory cell capacitors.

18 Claims, 8 Drawing Sheets

US 8,779,849 B2

APPARATUSES AND METHODS FOR PROVIDING CAPACITANCE IN A MULTI-CHIP MODULE

TECHNICAL FIELD

This invention relates to multi-chip memories, and more specifically, in one or more embodiments to capacitive chips for multi-chip modules.

BACKGROUND OF THE INVENTION

Improvements in the design of semiconductor devices consistently involve an increase in both operating frequency and capacity of such devices. In many cases, these improvements are made with little increase, if not a decrease, in the size of these devices. As a result, density of components, such as transistors, on each of these devices has greatly increased. However, advancements in this regard have not been without their own bevy of drawbacks. For example, as operating frequencies and capacities of semiconductor devices have increased, so has the amount of noise generated from the increases in transistor switching, a drawback that has been even more difficult to address as a result of decreases in signal margins associated with higher frequencies and lower power supply voltages.

One typical approach that has been used to reduce unwanted noise has been the use of decoupling capacitors. As a result, high frequency signals may be filtered from power supply voltages provided to, and derived in, semiconductor devices. In particular, with multi-chip modules, capacitors have been placed on respective dies, but are subject to physical limitations of die surface areas. In part because these capacitors often are metal-insulator-metal (MIM) or metal-oxide-semiconductor capacitors (MOSCAPs), to provide sufficient capacitance, the desired sizes of these capacitors are at times too large for the capacitors to be located anywhere but the uppermost position of a die stack. Moreover, in some cases, the largest capacitor physically compatible with a multi-chip module may still not provide a desirable amount of capacitance.

Therefore, there is a need for a capacitive device that provides sufficient capacitance to a multi-chip module.

DETAILED DESCRIPTION

Certain details are set forth below to provide a sufficient understanding of embodiments of the invention. However, it will be clear to one having skill in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

Figure 1:
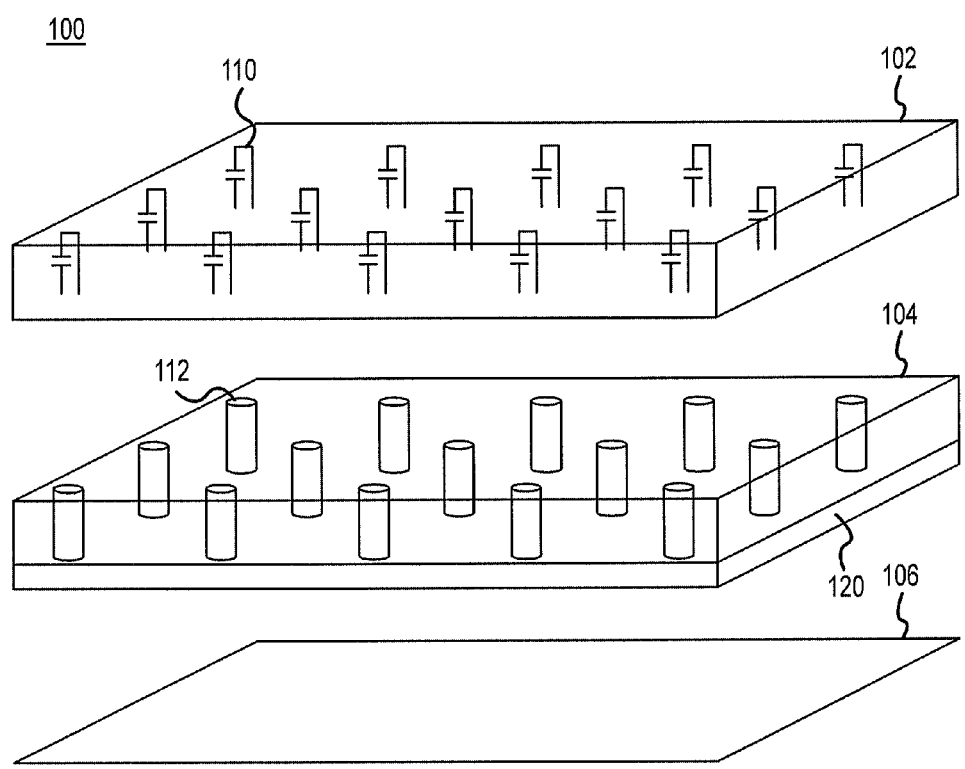
FIG. 1 illustrates an exploded perspective view of a multi-chip module according to an embodiment of the invention.

FIG. 1 illustrates an exploded perspective view of a multi-chip module 100 according to an embodiment of the invention. The multi-chip module 100 may include a signal distribution component 106, an integrated circuit (IC) chip 104, and a capacitive chip 102, that may be arranged in a stacked configuration. In one embodiment, the signal distribution component 106 may be coupled to traces on a semiconductor substrate (e.g., via conductive balls, solder bumps, (neither shown), or through other implementations). Moreover, the signal distribution component 106 may be coupled to an external controller (not shown) to receive power supply voltages and/or control signals and may further receive signals from other external devices. As will be explained in more detail below, the signal distribution component 106 may be electrically coupled to the IC chip 104 and the capacitive chip 102. In some embodiments, the signal distribution component 106 may be used to distribute power supply voltages and/or control signals to chips in the multi-chip module 100.

The IC chip 104, the capacitive chip 102, and the signal distribution component 106 in the multi-chip module 100 may be coupled by respective redistribution layers (not shown) and/or die interconnects, such as pads, solder bumps, microbumps, or copper pillars. Any number and/or size of interconnects may be used, allowing for respective resistances (e.g. effective series resistance) between the IC chip 104, the capacitive chip 102, and/or the signal distribution component 106, to be increased or decreased as desired. Moreover, in some embodiments, redistribution layers may be configured to align die interconnects of the IC chip 104, the capacitive chip 102, and the signal distribution component 106, and may also be configured to short multiple die interconnects together such that respective resistances between IC chip 104, the capacitive chip 102, and the signal distribution component 106 may be increased or decreased.

The IC chip 104 may comprise a plurality of vias 112 and an integrated circuit 120. The vias 112 may be through-silicon vias (TSVs), or may be other conductive elements, and further may be coupled to the die interconnects. The power supply voltages and/or signals may be coupled throughout the multi-chip module 100 using the vias 112 and the die interconnects. For example, the TSVs may be configured to couple the capacitive chip 102 to the IC chip 104 and signal distribution component 106. The IC 120 may comprise a controller, that in at least one embodiment, may be configured to provide memory commands to a memory and/or interface with a processing device (not shown), such as a processor or signal processing device. A controller may comprise one or more logic circuits, control logic, control circuitry, software, firmware, microcode, and/or any combination or sub-combination of the same. In one embodiment, the memory array and processing device may be included in the multi-chip module 100, and in other embodiments may be coupled to the multi-chip module 100.

The capacitive chip 102 may comprise a plurality of capacitive units 110 that, as will be explained in more detail below, may be configured to provide capacitance in the multi-chip module 100. For example, the capacitive units 110 may be configured to provide capacitance to various power supply voltages in the multi-chip module 100. The capacitive chip 102 may, for instance, be dedicated to providing capacitance in the multi-chip module 100 and/or to various power supply voltages. The power supply voltages may be voltages provided to, or derived in, the multi-chip module 100. The power supply voltages may, for example, include a high supply voltage, such as VCC, and a low supply voltage, such as VSS or ground. The capacitive units 110 may be formed using various capacitance configurations. In at least one embodiment, the capacitive units 110 may be formed from memory cell capacitors, and in other embodiments, the capacitive units 110 may comprise metal oxide semiconductor capacitors (MOSCAPs), metal-insulator-metal (MIM) capacitors, or any other capacitive configuration now and later known to those having ordinary skill in the art. Moreover, the capacitive units 110 may be configured to provide various magnitudes of capacitance. For example, in at least one embodiment, each of the capacitive units 110 may be configured to provide the same magnitude of capacitance, such as 100 femtofarads (fF). In other embodiments, the capacitive units 110 may provide varying magnitudes of capacitance.

The capacitive units 110 may also be configured to store electrical charge received from power supply voltages and subsequently provide electrical charge to devices in the multi-chip module 100. That is, the capacitive units 110 may be configured to provide battery power in the multi-chip module 100. For example, in the event that power is no longer provided from an external power source (e.g. power supply) to the multi-chip module 100, and more specifically, to signal distribution component 106, electrical charge stored in capacitive units 110 may be provided to chips in the multi-chip module 100 to allow continued operation. Further, in some embodiments, capacitive units 110 may be further configured to provide power to other devices as well, for example, other multi-chip modules or memory die stacks.

The capacitive units 110 may also be distributed throughout the capacitive chip 102 in any physical arrangement. For example, capacitive units 110 may be arranged in the capacitive chip in a uniform distribution. Alternatively, capacitive units 110 may be arranged in clusters or may be more heavily concentrated toward the center or edges of a capacitive chip. As will be explained in more detail below, because capacitive units 110 may be distributed in any arrangement throughout the capacitive chip 102, all power supply voltages received and/or distributed by signal distribution component 106 may be coupled to any number of capacitive units 110.

As previously discussed, the signal distribution component 106 may be coupled to the capacitive chip 102 and the IC chip 104. In an example operation, power supply voltages may be provided from the signal distribution component 106 to the capacitive units 110 in the capacitive chip 102, for example, through the vias 112. This may allow the capacitive units 110 to decouple noise from the power supply voltages. As a result, power delivery to the multi-chip module 100 may be enhanced and operating margins increased. Additionally, power supply voltages may be provided from the signal distribution component 106 to chips in the multi-chip module 100. These power supply voltages may further be divided into various chip-level power supply voltages to provide different degrees of noise immunity between various circuits and functions in each chip. Any number of capacitive units 110 may be coupled to each of the power supply voltages, thereby providing respective capacitances. In at least one embodiment, the same amount of capacitance may be provided to each power supply voltage. In other embodiments, the capacitances provided to each power supply voltage may vary and/ or be adjustable such that the capacitances may be increased or decreased to compensate for fluctuations or differences in signal characteristics.

For example, as previously discussed, the IC 120 may include a controller. As a result, the IC 120 may be configured to program the capacitive chip 102 such that any number of power supply voltages in the multi-chip module 100 may be provided with specific capacitances. Additionally, in some embodiments, the IC 120 may be further configured to enable and disable capacitive units 110 in real-time based on signal characteristics, such as noise and operating margins. As will be explained in more detail below, in at least one embodiment, the controller of the IC 120 may control programmable circuitry in the capacitive chip 102 to enable and/or disable various capacitive units 110.

Resistances (e.g. effective series resistance) between a capacitive unit 110 and one or more chips in the multi-chip module may also be increased or decreased. The IC 120 may, for instance, couple or decouple one or more die interconnects (e.g. die interconnects in parallel) between a capacitive unit 110 and a chip and/or power supply voltage, thereby allowing resistance and capacitance to be adjusted independently. For example, the IC 120 may couple or decouple a die interconnect by enabling or disabling one or more logic gates (e.g. transistor passgates) during an initialization and/or operation of the multi-chip module 100.

Figure 2:
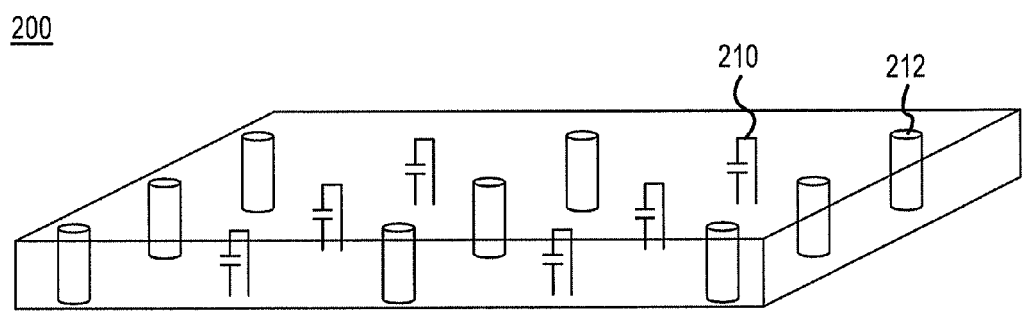
FIG. 2 illustrates a perspective view of a capacitive chip according to an embodiment of the invention.

FIG. 2 illustrates a perspective view of a capacitive chip 200 according to an embodiment of the invention. As shown, the capacitive chip 200 may include both capacitive units 210 and vias 212. The capacitive units 210 and vias 212 may be distributed in any configuration. For example, the capacitive units 212 and vias 212 may be distributed in a uniform distribution, or in alternating rows as shown in FIG. 2. In another embodiment, the capacitive units 210 and vias 212 may be arranged in a checkered pattern. The capacitive chip 200 may include any number of capacitive units 210 and vias 212, and the capacitive units 210 may each be configured to provide various magnitudes of capacitance.

The capacitive chip 200 may be coupled to other chips in a multi-chip module, such as the IC chip 104 included in the multi-chip module 100 illustrated in FIG. 1. The capacitive chip 200 may also include an integrated circuit (not shown). The IC may comprise a controller for providing memory commands and/or to configure the capacitance provided by the capacitance units 210 in the capacitive chip 200 and/or other capacitive chips included in the multi-chip module. The vias 212 may be used to provide electrical coupling with and through the capacitive chip 200. For example, the capacitive chip may be positioned between two other chips, and the vias 212 may be used to electrically couple the chips.

Figure 3:
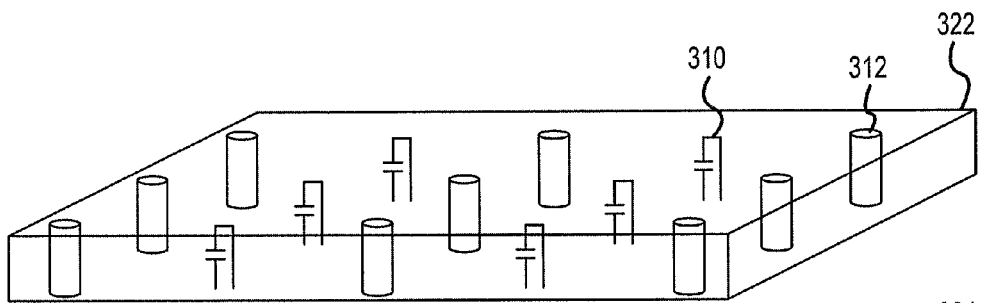
FIG. 3 illustrates an exploded perspective view of a multi-chip module according to an embodiment of the invention.
Figure 3:
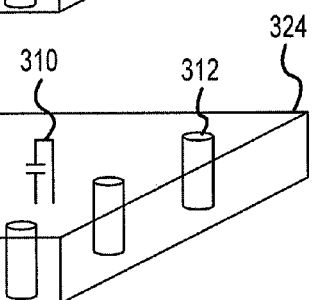
Figure 3:
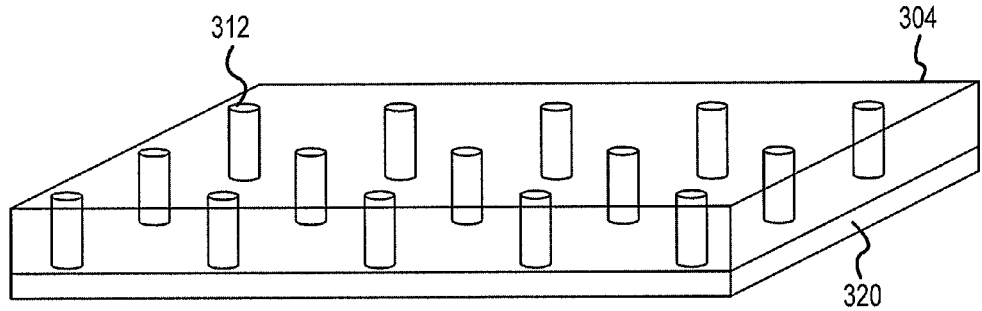
Figure 3:
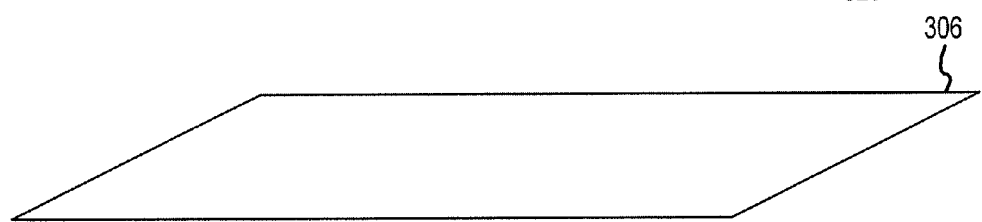

FIG. 3 illustrates an exploded perspective view of a multi-chip module 300 according to an embodiment of the present invention. The multi-chip module 300 may include a signal distribution component 306 and an integrated circuit chip 304. The signal distribution component 306 and the IC chip 304 may be similar to the signal distribution component 106 and the IC chip 104 of the embodiment previously described with reference to FIG. 1, respectively. The multi-chip module 300 may further include capacitive chips 322 and 324. The capacitive chips 322, 324 may each include capacitive units 310 and vias 312. In at least one embodiment, capacitive chips 322 and 324 may be similar to the capacitive chip 200 of FIG. 2. The capacitive units 310 in capacitive chips 322, 324 may be configured to provide capacitance in the multi-chip module 300. For example, the capacitive units 310 may be configured to provide capacitance to power supply voltages in the multi-chip module 300. In at least one embodiment, the capacitive units 310 may be configured to be controlled by a controller. The chips included in multi-chip module 300 may be arranged in a stacked formation and may be coupled together by die interconnects. The chips of the multi-chip module 300 may be coupled to one another by the die interconnects and the vias 312.

As shown in FIG. 3, capacitive chips 322, 324 may be adjacently located in the stack of the multi-chip module 300. In other embodiments, any number of capacitive chips may be used, and each capacitive chip may be located at any position in the multi-chip module 300. For example, in at least one embodiment, the capacitive chip 322 and/or the capacitive chip 334 may be located between the signal distribution component 306 and the IC chip 304. In another embodiment, additional capacitive chips may be included in multi-chip module 300. It will be appreciated by those having ordinary skill in the art that other arrangements of chips in a multi-chip module may also be used without departing from the scope of the present invention. It will be further appreciated that the number of chips included in a multi-chip module may be modified without departing from the present scope of the invention. In one embodiment, including a capacitive chip may allow for chips and/or signal distribution components to be capacitively isolated. For example, placing a capacitive chip between the signal distribution component 306 and the IC chip 304 may capacitively isolate the signal distribution component 306 and the IC chip 304.

Figure 4:
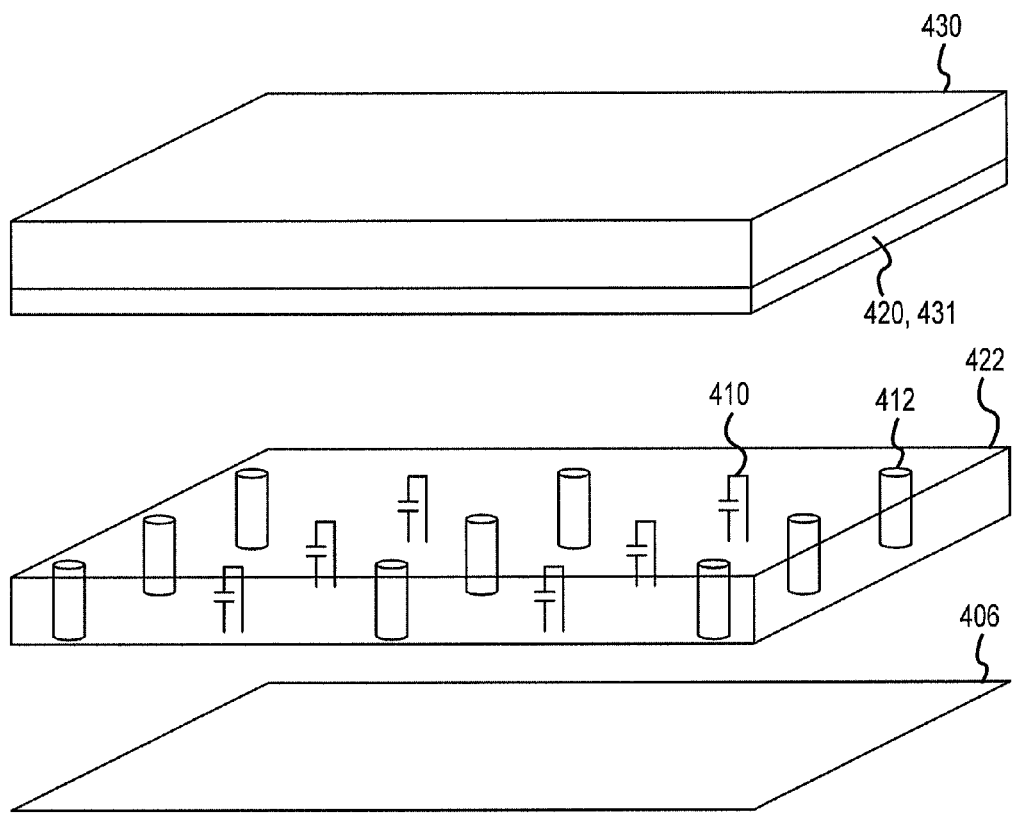
FIG. 4 illustrates an exploded perspective view of a multi-chip module according to an embodiment of the invention.

FIG. 4 illustrates an exploded perspective view of a multi-chip module 400 according to an embodiment of the present invention. The multi-chip module 400 may include a signal distribution component 406 that may be configured to receive power supply voltages and control signals from an external source. Additionally, the multi-chip module 400 may include an integrated circuit chip 430 and a capacitive chip 422. The capacitive chip 422 includes capacitive units 410 and vias 412. The signal distribution component 406 and the capacitive chip 422 may be similar to the signal distribution component 306 and the capacitive chip 322 previously described with reference to FIG. 3, respectively. Accordingly, in the interest of brevity and to avoid redundancy, the operation of these components will not described in further detail.

The IC chip 430 includes an integrated circuit 420. The integrated circuit 420 may include a controller 431. The controller 431 may comprise one or more logic circuits, control logic, control circuitry, software, firmware, microcode, and/ or any combination or sub-combination of the same. In one embodiment, the controller 431 may be a microcontroller configured to perform logical operations and may be configured to provide memory commands, such as read and write commands, to a memory. The controller 431 may be configured to enable or disable, and/or configure the capacitive units 410 by providing control signals to the capacitive chip 422 or by providing control signals to the IC 420, that may in turn enable or disable, and/or configure the capacitive units 410. As previously described, in at least one embodiment, the capacitive units in the capacitive chip 422 may be enabled, disabled, and/or configured by controlling programmable circuitry in the capacitive chip 422. The controller 431 may also be configured to interface with a controller (not shown) coupled to the multi-chip module 400.

As with other chips included in a multi-chip module, the IC chip 430 may be positioned at any location in the stack of chips comprising multi-chip module 400. In embodiments in which IC chip 430 is located at the top of a stacked arrangement of the multi-chip module 400, a heat sink (not shown) may be coupled to the IC chip 430. The heat sink may be configured to act as a heat exchanging device such that it may transfer heat away from the IC chip 430 and other chips of the multi-chip module 400. In some embodiments, the IC chip 430 may include vias. In other embodiments, the IC chip may not includes any vias, as may be the case where the IC chip 430 is located at the top of a stacked arrangement of the multi-chip module 400.

Figure 5:
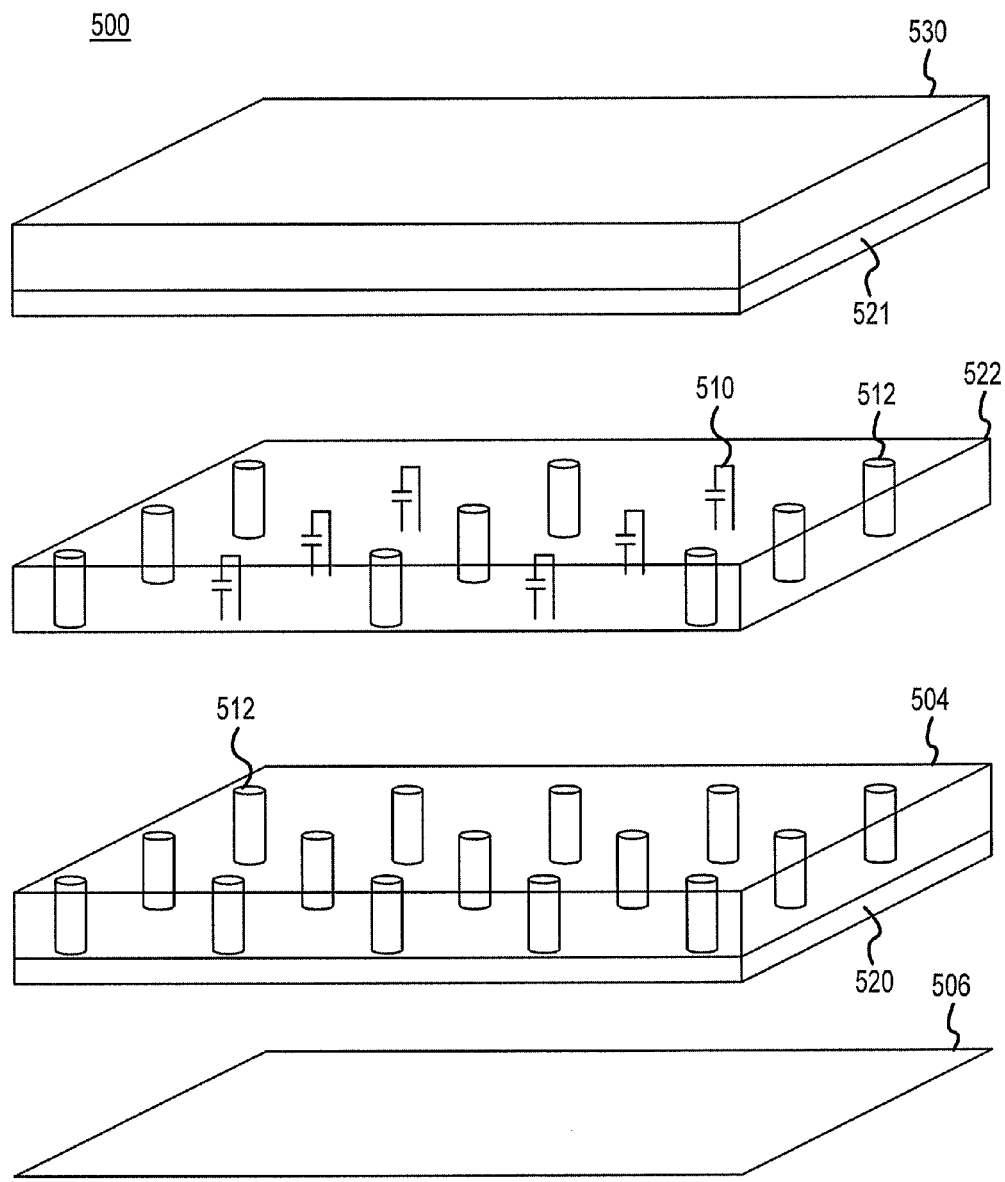
FIG. 5 illustrates an exploded perspective view of a multi-chip module according to an embodiment of the invention.

FIG. 5 illustrates a multi-chip module 500 according to an embodiment of the present invention. Multi-chip module 500 may include a signal distribution component 506 and an integrated circuit chip 504. The signal distribution component 506 and the IC chip 504 may be similar to the signal distribution component 106 and IC chip 104 previously described with reference to FIG. 1, respectively. The multi-chip module 500 may further include a capacitive chip 522 and an integrated circuit chip 530. The capacitive chip 522 and the IC chip 530 may be similar to the conductive chip 422 and the controller chip 430 previously described with reference to FIG. 4, respectively. Thus, in the interest of brevity and to avoid redundancy, the operation of these components will not described in further detail.

The IC chip 504 and the IC chip 530 may include integrated circuits 520 and 521, respectively. The ICs 520, 521 may include controllers configured to provide memory commands and configure capacitive units in a multi-chip module, such as the capacitive units 510 of the capacitive chip 522. As illustrated in FIG. 5, the capacitive chip 522 may be located between the IC chip 504 and the IC chip 530. The capacitive chip 522 may be used to provide capacitance in the multi-chip module 500. For example, the capacitive chip 522 may be used to provide isolation between the power supply voltages coupled to, and derived in, each chip of the multi-chip module 500. Multiple capacitive chips may be used to isolate various chips in the multi-chip module 500, and in another embodiment, capacitive chips may also be used to capacitively isolate the signal distribution component 506 from chips included in the multi-chip module 500. As previously stated, capacitive units in a capacitive chip may be distributed in any configuration and/or located at any position in the stack. Additionally, power supply voltages in the multi-chip module may be coupled to any number of capacitive units to improve noise immunity, power delivery, and signal operating margins.

FIG. 6 illustrates plan views of various configurations of capacitive unit groups according to some embodiments of the invention. FIG. 6A illustrates a plan view of a capacitive chip 601 including capacitive unit groups 603a-f of capacitive units 610. Each capacitive unit 610 in capacitive unit group 603a-f may be coupled to be used in a multi-chip module, such as the multi-chip module 100 illustrated in FIG. 1, and may further provide at least one pair of die interconnects for coupling the capacitive unit 610. Although the capacitive units 610 of a capacitive unit group 603 are illustrated in FIG. 6A as physically proximate to one another, the capacitive units 610 of a capacitive unit group 603 may be electrically coupled into a group and are not necessarily limited to being physically proximate to one another.

Figure 6B:
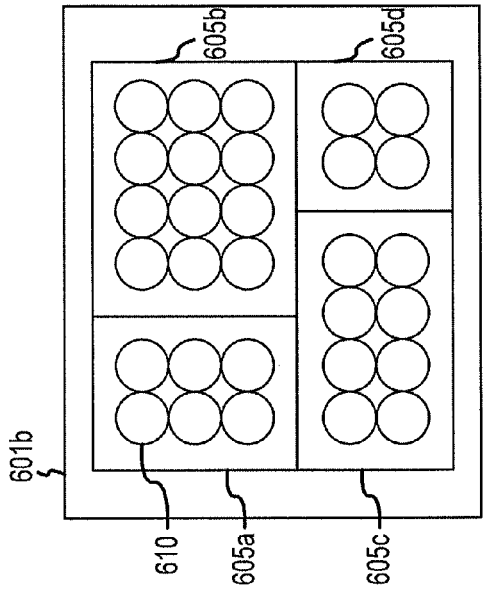
FIGS. 6A-6D illustrate plan views of capacitive chips according to embodiments of the invention.

In some embodiments, the capacitive units 610 of the capacitive unit groups 603a-f may be coupled to respective power supply voltages in a multi-chip module. As explained above, a capacitive chip may be configured such that it may provide various power supply voltages with specific amounts of capacitance. The capacitive unit groups 603a-f illustrated in FIG. 6A may be used for providing a same magnitude of capacitance, for example, to a respective power supply voltage the capacitive units 610 of each capacitive unit groups 603a-f is coupled. FIG. 6B shows a capacitive chip 601b having capacitive unit groups 605a-d. Each of the capacitive unit groups 605a-d may include any number of capacitive units 610 and further may be arranged in any configuration. Each of the capacitive unit groups 605a-d may be, for example, coupled to respective power supply voltages and provide a predetermined amount of capacitance to each. In embodiments where the capacitive units 610 have the same capacitance, the capacitive unit groups 605a-d represent groups having different magnitudes of capacitance. As a result, individual capacitances for each power supply voltage may be provided without programming or controlling capacitive units 610.

Figure 6D:
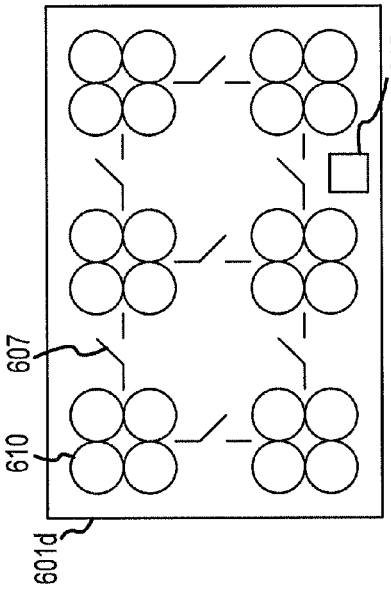
Figure 6A:
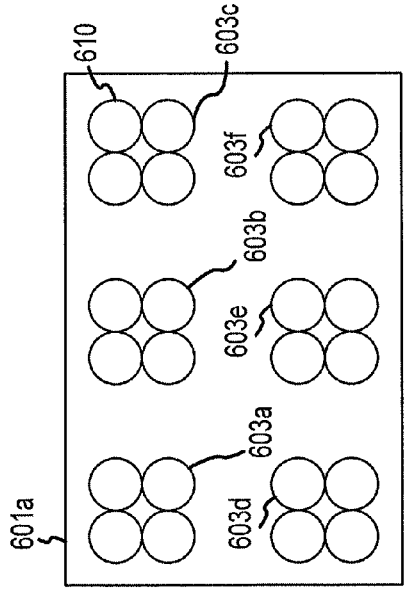
Figure 6C:
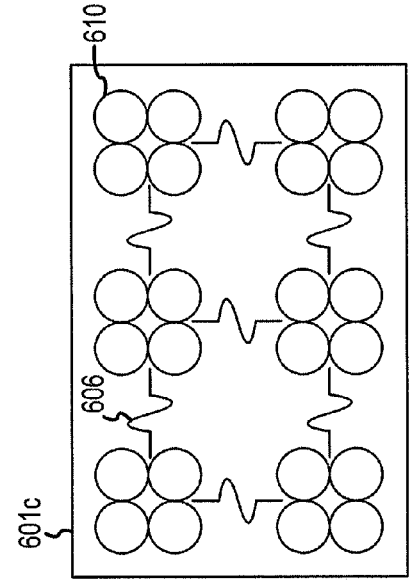

In some cases, however, it may be desirable to program a capacitive chip. That is, programming a capacitive chip may allow for different capacitive group configurations to be used without requiring the manufacture of capacitive chips having preset capacitances for capacitive unit groups. FIG. 6C illustrates a capacitive chip 601c that may include capacitive units 610 that, in at least in one embodiment, may be programmed into capacitive unit groups as desired. The capacitive chip 601c includes circuitry 606 that may programmed to couple the capacitive units 610 into desired capacitive unit groups. In some embodiments, the circuitry 606 represents fuses. The fuses may be blown (e.g., to provide an open circuit) to electrically isolate capacitive units 610 into capacitive unit groups such that each may be coupled to a power supply voltage to provide a particular capacitance. In another embodiment, capacitive units 610 in capacitive chip 601c may be coupled by circuitry 606 that represent antifuses, and groups of capacitive units 610 may be formed by shorting the antifuses (e.g., to provide a short circuit). In yet another embodiment, the capacitive chip 601c may include circuitry 606 representing both fuses and antifuses that are blown and shorted, respectively, in programming a capacitive chip. After the circuitry 606 is programmed for a capacitive unit group, the capacitance for that group may be set.

Other configurations may be used to program capacitive units 610 into desired capacitive unit groups as well. In fact, in some cases, it may be desirable to adjust capacitance provided by a capacitive unit group, for example, to adjust capacitance provided to each power supply voltage based on signal characteristics. FIG. 6D illustrates a capacitive chip 601d that includes capacitive units 610 and circuitry 607 that may be programmed and reprogrammed to couple the capacitive units 610 into desired capacitive unit groups. In some embodiments, the circuitry 607 may represent a plurality of switches that may be enabled and disabled before and/or during operation of the capacitive chip 601d to couple and decouple capacitive units 610. An example of a switch that may be used is a pass-gate switch, however, other switches now or later known may be used as well. For example, the circuitry 607 may be transistors, diodes, a controller combining such elements, and may be forms of electrical switches known by those having ordinary skill in the art.

Additionally, in at least one embodiment, the capacitive chip 601d may include a controller 615 that may be configured to control the circuitry 607 such that capacitive units 610 may provide an adjustable amount of capacitance. For example, the circuitry 607 may be controlled to couple and decouple capacitive units 610 from various signals. Further, coupling and decoupling capacitive units 610 may adjust the resistance between various chips in a multi-chip module, such as an integrated circuit chip and/or the capacitive chip 601d, and in at least one embodiment, respective resistances may be adjusted independently of capacitances. The controller 615 may be configured to receive control signals from a controller (not shown) included in a multi-chip module, or in another embodiment, the controller 615 may receive control signals from an external controller (not shown). In yet another embodiment, controller 615 may monitor power supply voltages in a multi-chip module and allocate capacitances to power supply voltages accordingly. In yet another embodiment, capacitive chip 601d may not include a controller, and instead receive control signals from the controller included in the multi-chip module or the external controller, and in response control the circuitry 607 based on the control signals. The capacitive chip 601d may include any number of capacitive units 610, capacitive unit groups, and circuitry 607, and these elements may be arranged in any physical configuration.

Figure 7:
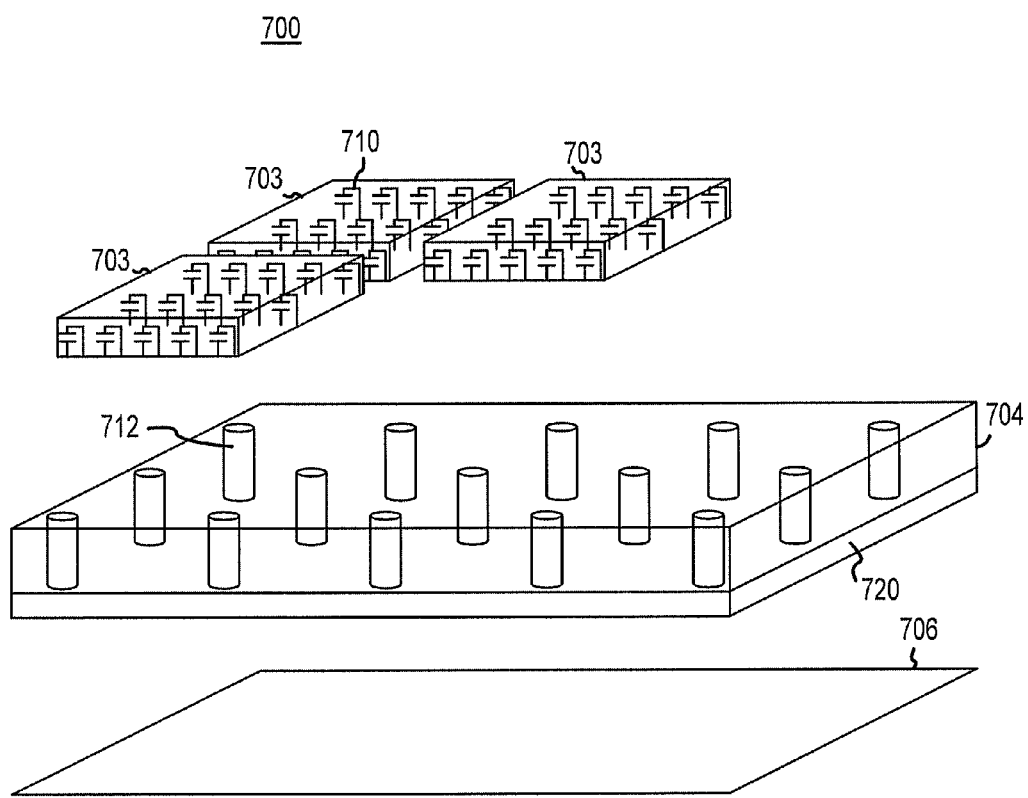
FIG. 7 illustrates an exploded perspective view of a multi-chip module according to an embodiment of the invention.

As discussed above, it may be desirable to provide power supply voltages of a chip with specific amounts of capacitance. Moreover, in some cases, a chip may require that a number of power supply voltages be coupled to dedicated capacitive structures, such as a dedicated capacitive chip. FIG. 7 illustrates an exploded view of a multi-chip module 700. The multi-chip module 700 may include a signal distribution component 706 and an integrated circuit chip 704. The signal distribution component 706 and the IC chip may be similar to the signal distribution component 106 and the IC chip 104 of FIG. 1, respectively. The multi-chip module 700 may include a plurality of capacitive chips 703 that, in at least one embodiment, may be configured to be stacked with chips in the multi-chip module 700, such as the IC chip 704. The capacitive chips 703 may be configured to have different dimensions than other chips in multi-chip modules, such as the IC chip 704.

The capacitive chips 703 may be configured to provide capacitance in the multi-chip module 700. For example, as illustrated in FIG. 7, multiple capacitive chips 703 may be stacked with and coupled to the IC chip 704, with capacitive units 710 located in each respective capacitive chips 703 being coupled to respective power supply voltages. In some embodiments, the capacitive chips 703 may be configured such that multiple capacitive chips 703 may be stacked on the same surface of another chip of the multi-chip module 700. That is, in at least one embodiment, capacitive chips 703 may be physically smaller than other chips in the multi-chip module 700 and may be positioned on a portion of a chip having power supply voltages where additional capacitance is desirable. For example, the capacitive chips 703 may have smaller surface areas than the IC chip 704, thereby allowing for multiple capacitive chips 703 to be attached over a surface of the IC chip 704. Each of the capacitive chips 703 may be configured the same or differently, and may have the same or different magnitudes of capacitance.

Figure 8:
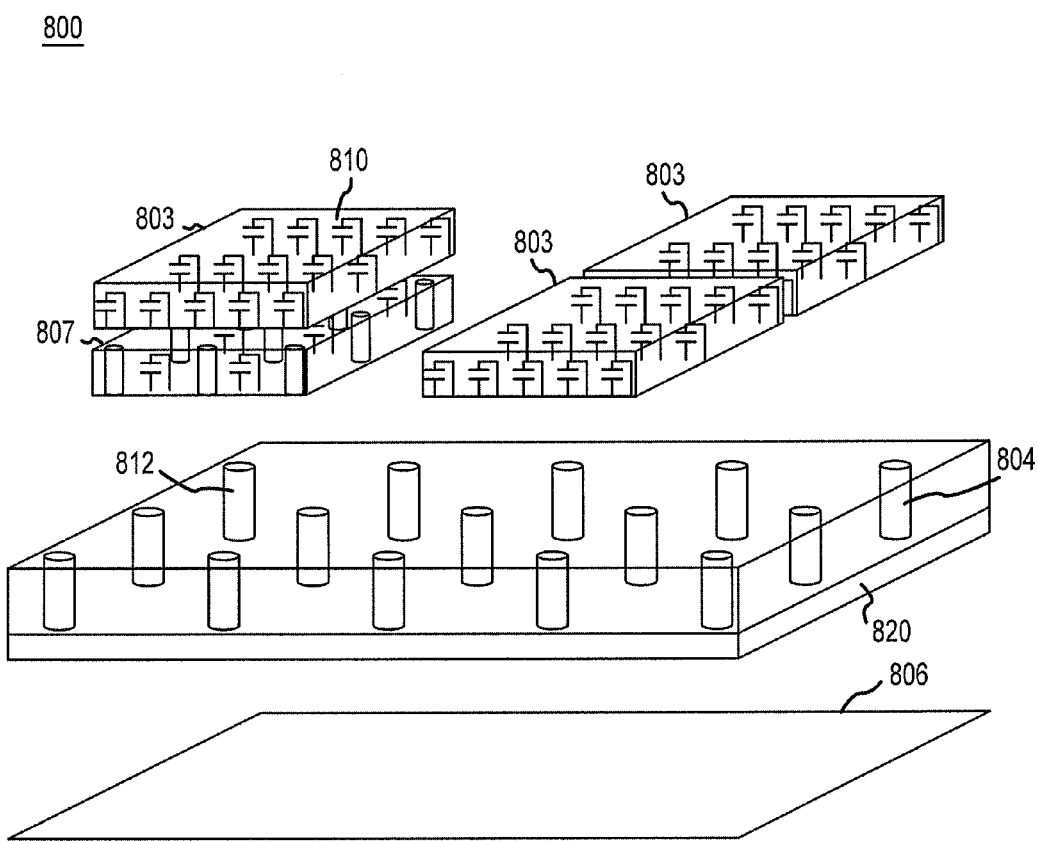
FIG. 8 illustrates an exploded perspective view of a multi-chip module according to an embodiment of the invention.

FIG. 8 illustrates an exploded perspective view of a multi-chip module 800 according to an embodiment of the present invention. FIG. 8 may include a signal distribution component 806 and an integrated circuit chip 804. The signal distribution component 806 and the IC chip 804 may be similar to the signal distribution component 106 and IC chip 104 of FIG. 1. The multi-chip module 804 may also include capacitive chips 803 that may be stacked on IC chip 804, or another chip that may be included in a multi-chip module. The capacitive chips 803 may comprise capacitive units 810 and, as described above, may be configured to provide capacitance to at least one power supply voltage of a chip in the multi-chip module 800. Moreover, the multi-chip module 800 may further include a capacitive chip 807 that may comprise capacitive units 810 and vias 812. The capacitive chip 807 may be coupled between the IC chip 804 and a capacitive chip 803 such that the capacitive chip 807 may provide capacitance to at least one power supply voltage in the multi-chip module 800 and further couple the capacitive units 810 in capacitive chip 803 to the same or a different power supply voltage in the multi-chip module 800. That is, in at least one embodiment, a capacitive chip 803 may be stacked with a capacitive chip 807, and as a result, capacitance from both the capacitive chip 803 and the capacitive chip 807.

From the foregoing it will be appreciated that, although specific embodiments of the invention have been described herein for purposes of illustration, various modifications may be made without deviating from the spirit and scope of the invention. For example, although the embodiments are explained in the context of stacked chips, it will be understood that the chips may be arranged differently, such as side-by-side. Accordingly, the invention is not limited except as by the appended claims.

What is claimed is:

1. A multi-chip module, comprising
a signal distribution component configured to provide a power supply voltage;
a capacitive chip coupled to the signal distribution component and having a plurality of capacitive units, the capacitive chip configured to provide a capacitance to the power supply voltage, wherein the plurality of capacitive units are formed from memory cell capacitors; and
an integrated circuit chip coupled to at least one of the signal distribution component or the capacitive chip, wherein the integrated circuit chip comprises a controller configured to provide memory commands to a memory.

2. The multi-chip module of claim 1, wherein the integrated circuit chip is configured to receive the power supply voltage.

3. The multi-chip module of claim 1, wherein the capacitive chip further comprises a controller configured to adjust the magnitude of the capacitance.

4. The multi-chip module of claim 1, wherein the controller is further configured to enable and disable a capacitive unit of the plurality of capacitive units.

5. The multi-chip module of claim 1, wherein the capacitive chip is a dedicated capacitive chip.

6. The multi-chip module of claim 1, wherein the capacitive chip is configured to capacitively isolate the integrated circuit chip and the signal distribution component.

7. The multi-chip module of claim 1, wherein the capacitive chip comprises a plurality of through-silicon vias.

8. The multi-chip module of claim 1, wherein the capacitive chip further comprises a second capacitive chip coupled to the first capacitive chip, the second capacitive chip having a second plurality of capacitive units, wherein the second plurality of capacitive units is configured to provide a second capacitance, wherein the second capacitive chip includes a plurality of vias, the plurality of vias configured to couple a power supply voltage through the second capacitive chip.

9. The multi-chip module of claim 1, wherein the capacitive chip further comprises a plurality of vias configured to couple a plurality of signals from a first set of die interconnects to a second set of die interconnects; and
a plurality of capacitive units configured to provide a plurality of capacitances, wherein the plurality of vias and the plurality of capacitive units are arranged in a uniform distribution.

10. The multi-chip module of claim 8, wherein the first capacitive chip comprises programmable circuitry.

11. The multi-chip module of claim 10, wherein the first capacitive chip further comprises a controller configured to control the programmable circuitry to adjust the first capacitance.

12. The multi-chip module of claim 8, wherein the first and second capacitive chips are coupled by a plurality of die interconnects.

13. The multi-chip module of claim 8, further comprising:
an integrated circuit chip configured to interface with an external controller.

14. The multi-chip module of claim 8, wherein the first and second capacitances are based, at least in part, on signal characteristics of respective power supply voltages.

15. The multi-chip module of claim 1, wherein the capacitive chip has a smaller surface than the integrated circuit chip.

16. The capacitive chip of claim 9, wherein the vias comprise through-silicon vias.

17. The capacitive chip of claim 9, wherein the plurality of capacitive units are further configured to store electrical charge and provide electrical charge to an integrated circuit chip coupled to the capacitive chip in a stacked configuration.

18. The capacitive chip of claim 9, wherein the plurality of capacitive units comprise a first capacitive unit group and a second capacitive unit group, the first capacitive unit group coupled to the second capacitive unit group by a fuse, an antifuse, a switch or combinations thereof.

* * * * *